US008822987B2

(12) United States Patent
Fujita et al.

(10) Patent No.: US 8,822,987 B2
(45) Date of Patent: Sep. 2, 2014

(54) ELECTRO-OPTICAL DEVICE AND ELECTRONIC APPARATUS

(71) Applicant: Seiko Epson Corporation, Tokyo (JP)

(72) Inventors: Shin Fujita, Suwa (JP); Takayuki Kitazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 8 days.

(21) Appl. No.: 13/687,526

(22) Filed: Nov. 28, 2012

(65) Prior Publication Data

US 2013/0140538 A1 Jun. 6, 2013

(30) Foreign Application Priority Data

Dec. 5, 2011 (JP) ................. 2011-265503

(51) Int. Cl.
*H01L 35/24* (2006.01)
*H01L 51/00* (2006.01)
*H01L 27/32* (2006.01)
*G09G 3/32* (2006.01)

(52) U.S. Cl.
CPC .... *H01L 27/3225* (2013.01); *G09G 2300/0852* (2013.01); *G09G 2300/0861* (2013.01); *H01L 27/3276* (2013.01); *G09G 3/3233* (2013.01); *H01L 27/326* (2013.01)
USPC .................. 257/40; 257/370; 345/76

(58) Field of Classification Search
USPC ................. 257/40, 370; 345/76, 211
See application file for complete search history.

(56) References Cited

U.S. PATENT DOCUMENTS

| 5,610,403 A * | 3/1997 | Kingsley et al. .......... 250/370.09 |
| 2005/0206590 A1 | 9/2005 | Sasaki et al. |
| 2007/0120118 A1* | 5/2007 | Kubota et al. .................. 257/40 |
| 2009/0303212 A1 | 12/2009 | Akutsu et al. |
| 2010/0182303 A1 | 7/2010 | Takasugi et al. |
| 2010/0259710 A1 | 10/2010 | Oomura |
| 2011/0141084 A1* | 6/2011 | Kishi ............................ 345/211 |
| 2012/0229438 A1 | 9/2012 | Fujita |

FOREIGN PATENT DOCUMENTS

| JP | A-2003-271095 | 9/2003 |
| JP | A-2006-30635 | 2/2006 |
| JP | A-2006-350162 | 12/2006 |
| JP | A-2007-316615 | 12/2007 |
| JP | A-2009-300480 | 12/2009 |
| JP | A-2012-189828 | 10/2012 |
| WO | WO 2009/017122 A1 | 2/2009 |

\* cited by examiner

*Primary Examiner* — Phuc Dang
(74) *Attorney, Agent, or Firm* — Oliff PLC

(57) ABSTRACT

An electro-optical device includes a first pixel circuit having a first light emitting element; a second pixel circuit having a second light emitting element arranged adjacent to the first light emitting element along a first direction; a first data line arranged along a second direction crossing the first direction, the first data line being electrically connected to the first pixel circuit; a second constant potential wiring line arranged along the second direction, the second constant potential wiring line being electrically connected to the second pixel circuit; a wiring line connected to the second constant potential wiring line. The first data line and the wiring line overlap when seen from a third direction perpendicular to the first direction and to the second direction.

20 Claims, 7 Drawing Sheets

ELECTRO-OPTICAL DEVICE AND ELECTRONIC APPARATUS

BACKGROUND

1. Technical Field

The present invention relates to an effective electro-optical device and an electronic apparatus that are effective when a pixel circuit is miniaturized, for example.

2. Related Art

Various types of electro-optical devices using light emitting elements such as organic light emitting diodes (hereinafter referred to as "OLEDs") have recently been proposed. A typical configuration of such an electro-optical device is that pixel circuits including the above-mentioned light emitting elements, transistors, and other components are provided so as to correspond to pixels of an image to be displayed, in such a manner that the pixel circuits are arranged at positions corresponding to intersections of scanning lines and data lines. A pixel circuit using an OLED typically includes a write transistor that determines whether or not a data signal can be input from a data line, and a driving transistor that determines, on the basis of information on the determination, the amount of a current to be supplied to the OLED. The pixel circuit also includes a storage capacitor holding a data signal supplied from the data line. Furthermore, there is a technology using more elements for the purpose of achieving high image quality (for example, refer to JP-A-2003-271095).

When a pixel circuit having a configuration as mentioned above is actually driven, variations in the potential levels of data lines cause noise. The current supplied to the OLED is determined by a voltage between the gate and source of a driving transistor. Therefore, when the noise affects the gate node and the source node of the driving transistor, an accurate luminance cannot be displayed. Thus, there is unevenness in luminance. In particular, this becomes a large problem in the case where pixel circuits are arranged at narrow pitches and therefore a storage capacitor connected to the gate node cannot be increased in size. With the existing structure, noise of a data line invades the gate and source nodes of the driving transistor via a parasitic capacitance. This invasion causes data signals accumulated in the storage capacitor to vary, and, as a result, a current supplied via the driving transistor to an OLED element varies similarly. This variation is visually recognized as luminance unevenness, causing a decrease in display quality.

SUMMARY

An advantage of some aspects of the invention is that it reduces degradations in image quality degradation associated with variations in potential of data lines.

An electro-optical device according to an aspect of the invention includes a plurality of scanning lines and a plurality of data lines crossing each other, a plurality of pixel circuits provided corresponding to intersections of the scanning lines and the data lines, a constant potential wiring line provided for each of the plurality of pixel circuits, the constant potential wiring line being configured to supply a given potential, and a shield wiring line electrically connected to the constant potential line. Each of the plurality of pixel circuits includes a light emitting element, a driving transistor configured to control a current flowing through the light emitting element, and a switching transistor connected between a gate of the driving transistor and the data line, the switching transistor having a conductive state that is controlled depending on a scanning signal supplied to the scanning line. The shield wiring line is formed so as to extend from the constant potential wiring line for a pixel circuit adjacent to any one of the pixel circuits to a lower portion of a data line of the any one of the pixel circuits in such a manner that at least part of the shield wiring line crosses the data line.

According to the aspect of the invention, the shield wiring line extends from the constant potential wiring line of the adjacent pixel circuit to the lower portion of the data line in which noise is generated, and at least part of the shield wiring line crosses the data line. Accordingly, at this intersection, a parallel-plate capacitor is formed between the data line and the shield wiring line. This causes the field intensity from the data line to the gate of the driving transistor to become weaker, thereby significantly reducing a parasitic capacitance formed between the data line and the gate of the driving transistor. As a result, the effect of noise from the data line on the gate of the driving transistor is mitigated. Thus, high display quality is attained. Note that an end of a shield wiring line may extend closer to the gate of the driving transistor than to the data line, or may extend to a midpoint of the width in the lateral direction of the data line.

Moreover, although noise is applied to the shield wiring line itself, the noise application has no effect on display quality of the pixel in question because that shield wiring line extends from the constant potential wiring line of the adjacent pixel circuit in which a picture signal will be written next time. Even if variations due to noise occur in the adjacent pixel circuit, a normal picture signal is written at the next timing, and therefore the effect on display quality can be suppressed.

In the electro-optical device according to the aspect of the invention, it is preferable that, assuming that an area where the shield wiring line and the data line cross is a crossing area, the gate of the driving transistor be disposed within a width in the longitudinal direction of the data line in the crossing area. In this configuration, a parallel-plate capacitor is formed in the crossing area, and the gate of the driving transistor is disposed within the width in the longitudinal direction of the data line of the crossing area. Therefore, the field intensity from the data line to the gate of the driving transistor to be protected in the vicinity of the parallel-plate capacitor becomes weaker. This can significantly reduce a parasitic capacitance formed between the data line and the gate of the driving transistor. As a result, noise application to the gate of the transistor can be inhibited.

In the electro-optical device according to the aspect of the invention, the shield wiring line may be formed in a layer lower than the data line and be formed of a wiring layer that is the same layer as or a higher layer than the gate of the driving transistor. With this configuration, a parallel plate capacitor is preferentially formed between the wiring layer and the data line. Therefore, if a shield wiring line is formed of a wiring layer that is the same layer as or a higher layer than the gate of a driving transistor to be protected, most of the parasitic capacitance will be formed as the above parallel plate capacitor. Thus, a higher noise control effect is attained.

An electro-optical device according to another aspect of the invention includes a first pixel circuit having a first light emitting element, and a second pixel circuit having a second light emitting element arranged adjacent to the first light emitting element along a first direction. This electro-optical device includes a first constant potential wiring line that is arranged along a second direction crossing the first direction and is electrically connected to the first pixel circuit, a first data line that is arranged along the second direction and is electrically connected to the first pixel circuit, a second constant potential wiring line that is arranged along the second direction and is electrically connected to the second pixel circuit, a second data line that is arranged along the second direction and is electrically connected to the second pixel circuit, a driving transistor configured to control a current flowing through the first light emitting element, and a wiring line connected to the second constant potential wiring line. The first data line and the wiring line overlap when seen from a third direction perpendicular to the first direction and to the second direction.

According to this aspect of the invention, the wiring line, which is connected to the second constant potential wiring line of the second pixel circuit, and the first data line of the first pixel circuit in which noise is generated overlap when seen from the third direction, which is perpendicular to the first direction and to the second direction. Accordingly, in this overlapping portion, a parallel-plate capacitor is formed between the first data line and the wiring line. This causes the field intensity from the first data line to the gate of the driving transistor to become weaker, thereby significantly reducing a parasitic capacitance formed between the first data line and the gate of the driving transistor. As a result, the effect of noise from the first data line on the gate of the driving transistor is mitigated. Thus, high display quality is attained. Note that an end of the wiring line may extend closer to the gate of the driving transistor than to the first data line, or may extend to a midpoint of the width in the lateral direction of the first data line.

Moreover, although noise is applied to the wiring line itself, the noise application has no effect on display quality of the pixel in question because the wiring line extends from the second constant potential wiring line of the second pixel circuit in which a picture signal will be written next time. Even if variations due to noise occur in the second pixel circuit, a normal picture signal is written at the next timing, and therefore the effect on display quality can be suppressed.

In the electro-optical device according to this aspect of the invention, the first light emitting element may include a first pixel electrode, a counter electrode disposed so as to be opposite to the first pixel electrode, and an organic light emitting layer disposed between the first pixel electrode and the counter electrode. Also, the first pixel circuit may include a switching transistor disposed between a gate electrode of the driving transistor and the first data line, and a relay electrode connecting the gate electrode of the driving transistor and the switching transistor. Also, the relay electrode may be provided within a width of the wiring line when seen from the first direction.

In this configuration, a parallel-plate capacitor is formed in an area where the wiring line and the first data line overlap, and the relay electrode connecting the gate electrode of the driving transistor and the switching transistor is provided within the width of the wiring line when seen from the first direction. Therefore, the field intensity from the data line to the gate of the driving transistor to be protected in the vicinity of the parallel-plate capacitor becomes weaker. This can significantly reduce a parasitic capacitance formed between the first data line and the gate of the driving transistor. As a result, noise application to the gate of the transistor can be inhibited.

In the electro-optical device according to this aspect of the invention, the relay electrode may be provided in a layer between the first data line and the gate electrode of the driving transistor. The relay electrode may also be provided in the same layer as that of the gate electrode of the driving transistor.

Moreover, in the electro-optical device according to this aspect of the invention, the first light emitting element and the second light emitting element may emit light of different wavelengths.

Note that the invention can be conceptualized as an electro-optical device as well as a method of driving an electro-optical device or an electronic apparatus including the electro-optical device. Typical examples of the electronic apparatus include display devices such as a head-mounted display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENT

Hereinafter, an exemplary embodiment of the invention will be described with reference to the accompanying drawings.

Embodiment

Figure 1:
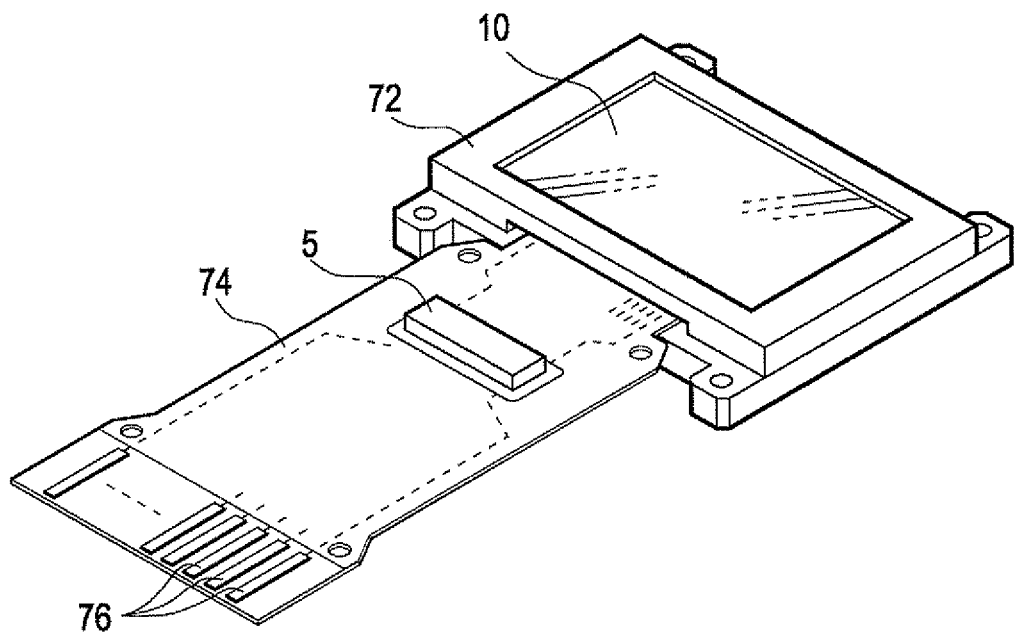
FIG. 1 is a perspective view illustrating an external configuration of an electro-optical device according to an embodiment of the invention.

FIG. 1 is a perspective view illustrating an external configuration of an electro-optical device 10 according to an embodiment of the invention. The electro-optical device 10 is a microdisplay that displays an image in a head-mounted display (HMD), for example. The electro-optical device 10, details of which will be described below, is an organic electroluminescent (EL) apparatus in which a plurality of pixel circuits, driving circuits for driving the pixel circuits, and other components are formed on a silicon substrate, for example. An OLED, which is an example of a light emitting element, is used in the pixel circuit.

The electro-optical device 10 is housed in a frame-shaped case 72 having an opening for a display section. One end of a flexible printed circuit (FPC) substrate 74 is connected to the electro-optical device 10. A control circuit 5 of a semiconductor chip is mounted on the FPC substrate 74 using a chip-on-film (COF) technology. The FPC substrate 74 is provided with a plurality of terminals 76 so as to be connected to a higher-level circuit, which is not illustrated. From the higher-level circuit, image data is supplied via the plurality of terminals 76 in synchronization with synchronizing signals. The synchronizing signals include a vertical synchronizing signal, a horizontal synchronizing signal, and a dot clock signal. The image data specifies, in 8 bits, for example, the gray scale levels of pixels of an image to be displayed.

The control circuit 5 performs both functions of a power supply circuit and a data signal output circuit of the electro-optical device 10. That is, the control circuit 5 supplies various control signals and various potentials generated in response to the synchronizing signals to the electro-optical device 10, and, in addition, the control circuit 5 converts digital image data to analog data signals and supplies them to the electro-optical device 10.

Figure 2:
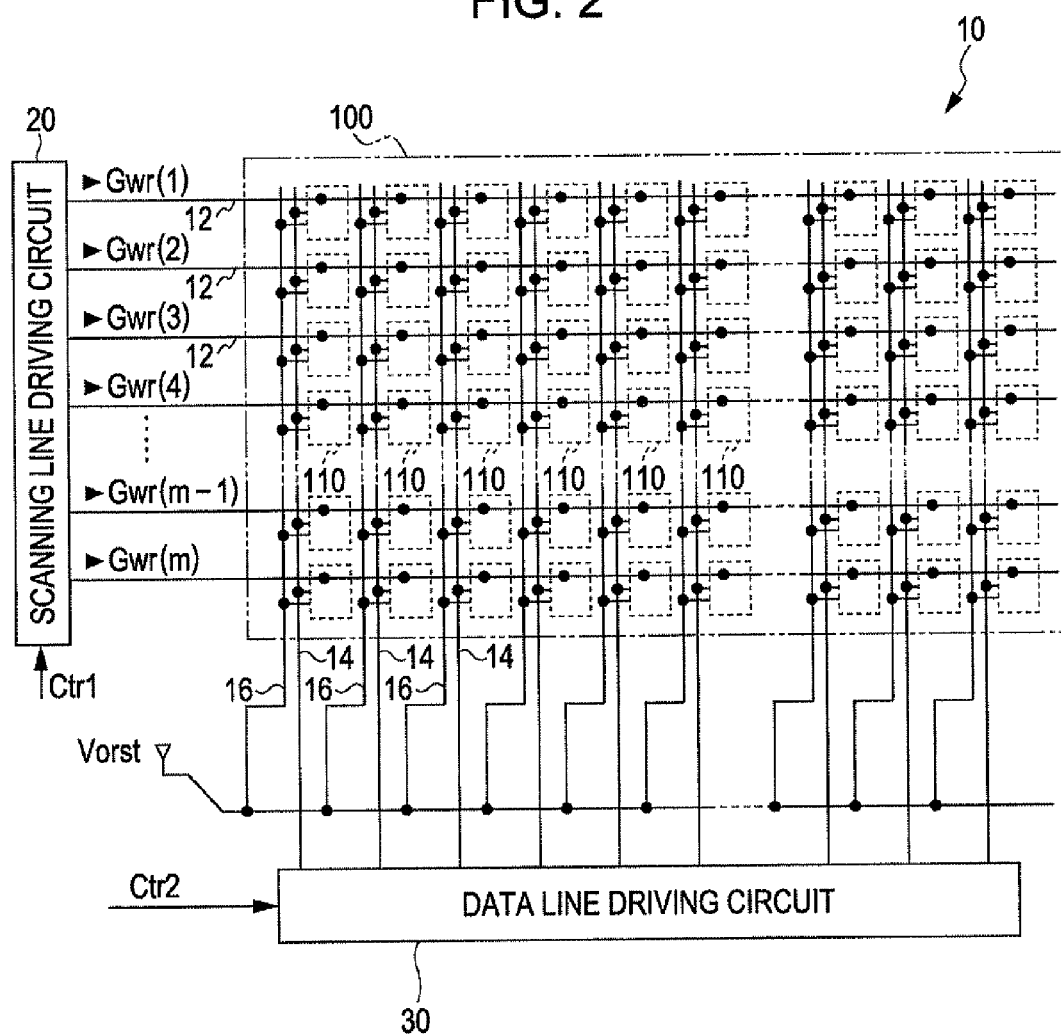
FIG. 2 is a block diagram illustrating a configuration of the electro-optical device.

FIG. 2 illustrates a configuration of the electro-optical device 10 according to this embodiment. As illustrated in this drawing, the electro-optical device 10 is roughly divided into a scanning line driving circuit 20, a data line driving circuit 30, and a display section 100.

In the display section 100, among the aforementioned, pixel circuits 110 corresponding to pixels of an image to be displayed are arranged in a matrix. In particular, in the display section 100, m scanning lines 12 are provided in such a manner that they extend in the lateral direction in the drawing, and n data lines 14 are provided in such a manner that they extend in the longitudinal direction in the drawing and in such a manner that electrical isolation between the data lines 14 and the scanning lines 12 is maintained. The pixel circuits 110 are provided corresponding to intersections of the m scanning lines 12 and the n data lines 14. For this reason, in this embodiment, the pixel circuits 110 are arranged in a matrix of m lines high×n rows wide.

Here, both m and n are natural numbers. In order to distinguish each row in the scanning lines 12 and the matrix of the pixel circuits 110, the rows may be referred to as the 1-st, 2-nd, 3-rd, . . . , (m−1)-th, and m-th row, respectively, in order from top to bottom in the drawing. Likewise, in order to distinguish each column in the data lines 14 and the matrix of the pixel circuits 110, the columns may be referred to as the 1-st, 2-nd, 3-rd, . . . , (n−1)-th, and n-th row, respectively, in order from left to right in the drawing.

In this embodiment, a supply line 16 is provided along the data line 14 for each row. A potential Vorst, as a reset potential, is supplied in common to all the power supply lines 16.

Now, the following control signals are supplied to the electro-optical device 10 by the control circuit 5. In particular, a control signal Ctrl for controlling the scanning line driving circuit 20 and a control Ctrl for controlling the data line driving circuit 30 are supplied to the electro-optical device 10.

In accordance with the control signal Ctrl, the scanning line driving circuit 20 generates scanning signals for scanning the scanning lines 12 sequentially, row by row, over the period of a frame. Here, the scanning signals supplied to the 1-st, 2-nd, 3-rd, . . . , (m−1)-th, and m-th scanning lines 12 are denoted by Gwr(1), Gwr(2), Gwr(3), . . . , Gwr(m−1), and Gwr(m), respectively.

Note that, in addition to the scanning signals Gwr(1) to Gwr(m), the scanning line driving circuit 20 generates various control signals in synchronization with the scanning signal in question for each row and supplies them to the display section 100. These control signals are not illustrated in FIG. 2. The period of a frame means a period that is needed for the electro-optical device 10 to display an image corresponding to one cut. When the frequency of a vertical synchronizing signal contained in the synchronizing signals is 120 Hz, for example, the period of a frame is 8.3 milliseconds corresponding to one period of the frequency.

In the data line driving circuit 30, the following operations are carried out. For the pixel circuits 110 located in a row selected by the scanning line driving circuit 20, data signals Vd(1), Vd(2), . . . , Vd(n) of potential levels in accordance with gray scale data of these pixel circuits 110 are supplied to 1-st, 2-nd, . . . , n-th data lines 14 by the control circuit 5, respectively.

Figure 3:
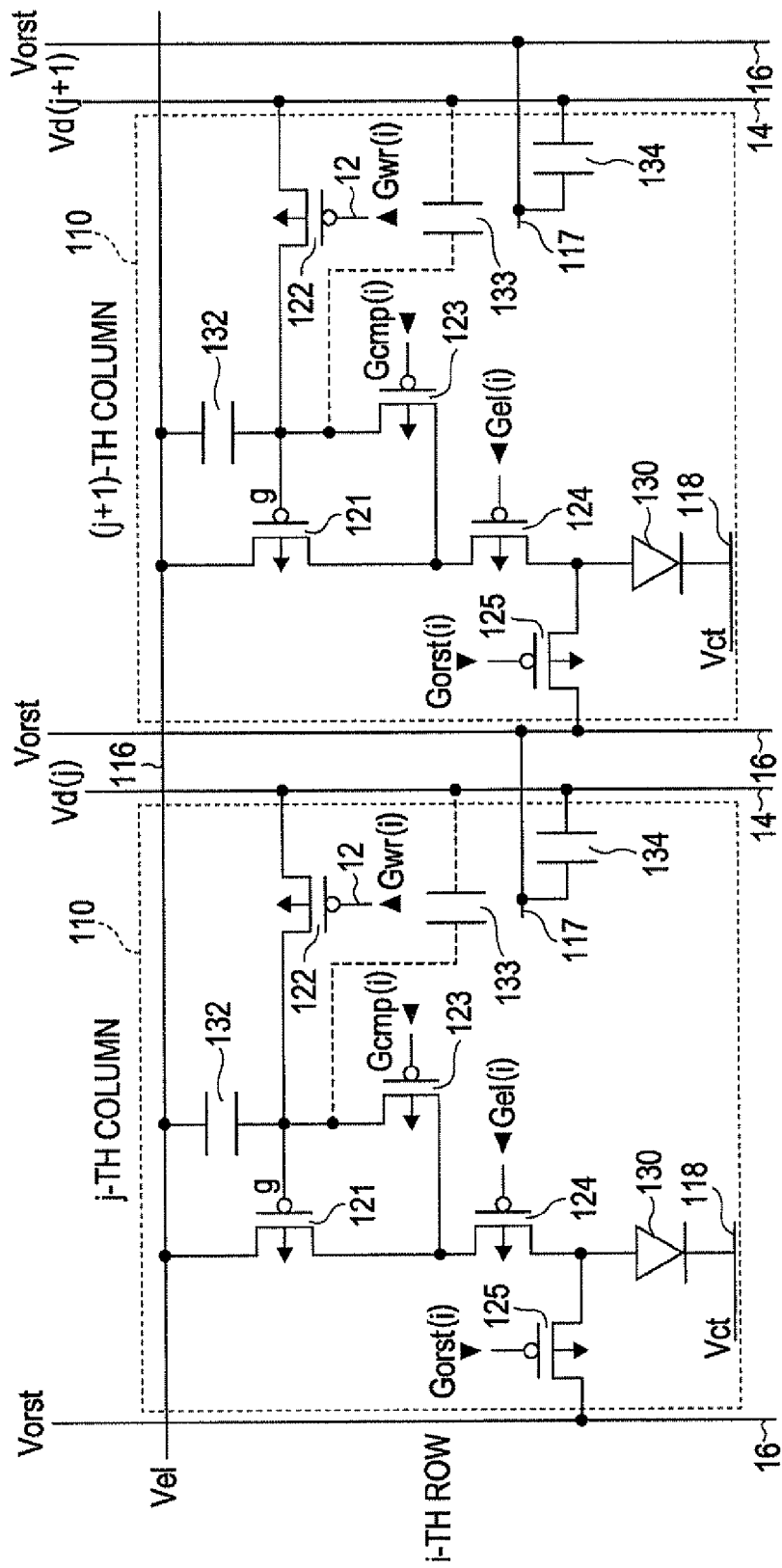
FIG. 3 illustrates pixel circuits in the electro-optical device.

With reference to FIG. 3, the pixel circuits 110 are now described. Note that FIG. 3 illustrates the pixel circuits 110 for two pixels, corresponding to intersections between an i-th row, or an i-th scanning line 12, and j-th and (j+1)-th data lines 14. The (j+1)-th data line 14 is to the right of and adjacent to the j-th data line 14. Here, "i" is a mark generally indicating a row in which the pixel circuits 110 are arranged, and is an integer of from 1 to m, both inclusive. Likewise, "j" and "(j+1)" are marks generally indicating columns in which the pixel circuits 110 are arranged, and are integers of from 1 to n, both inclusive. In this embodiment, the pixel circuit 110 for the intersection between the i-th row, or the i-th scanning line 12, and the j-th data line 14 corresponds to the first pixel circuit, and the pixel circuit 110 for the intersection between the i-th row, or the i-th scanning line 12, and the (j+1)-th data line 14 corresponds to the second pixel circuit. That is, the j-th data line 14 is the first data line, and the (j+1)-th data line 14 is the second data line.

As illustrated in FIG. 3, the pixel circuit 110 includes p-channel metal-oxide semiconductor (MOS) transistors 121 to 125, an OLED 130, and a storage capacitor 132. All the pixel circuits 110 have an identical configuration, and therefore a description will be given by using the one located at the i-th row and the j-th column (hereinafter referred to as the "i-th row and j-th column pixel circuit 110") as a representative.

Regarding the i-th row and j-th column pixel circuit 110, the transistor 122 functions as a write transistor. Its gate node is connected to the i-th scanning line 12, and one of its drain and source nodes is connected to the j-th data line 14 whereas the other is connected to a gate node g of the transistor 121, to an end of the storage capacitor 132, and to a drain node of the transistor 123. Here, the gate node of the transistor 121 is denoted by "g" so that it can be distinguished from other nodes. A scanning signal Gwr(i) is supplied to the i-th scanning line 12, that is, to a gate node of the transistor 122.

The transistor 121 functions as a driving transistor. Its source node is connected to a supply line 116, and its drain node is connected to a source node of the transistor 123 and to a source node of the transistor 124. Here, a substrate potential Vel, which is on the high side of the supply voltage in the pixel circuit 110, is supplied to the supply line 116.

The transistor 123 functions as a compensation transistor. A control signal Gcmp(i) is supplied to its gate node. The transistor 124 functions as a light emitting control transistor. A control signal Gel(i) is supplied to its gate node, and its drain node is connected to a source node of the transistor 125 and to the anode of the OLED 130.

The transistor 125 functions as an initialization transistor. A control signal Gorst(i) is supplied to its gate node, and its drain node is connected to a supply line (constant potential wiring line) 16 corresponding to the j-th column and is maintained at the potential Vorst.

Here, the transistor 121 corresponds to a first transistor, the transistor 122 corresponds to a second transistor, and the transistor 123 corresponds to a third transistor. The transistor 125 corresponds to a fourth transistor, and the transistor 124 corresponds to a fifth transistor.

The other end of the storage capacitor 132 is connected to the supply line 116. For this reason, the storage capacitor 132 holds a voltage between the source and drain of the transistor 121. Note that, as the storage capacitor 132, a parasitic capacitance associated with the gate node g of the transistor 121 may be used, and a capacitance formed by sandwiching an insulating layer between conductive layers that are different from each other in a silicon substrate may also be used.

Since the electro-optical device 10 is formed on a silicon substrate in this embodiment, the substrate potential of the transistors 121 to 125 is defined as the potential Vel.

The anode of the OLED 130 is a pixel electrode provided individually for each pixel circuit 110. In contrast, the cathode of the OLED 130 is the common electrode 118, which is common to all the pixel circuits 110, and is maintained at a potential Vct, which is on the low side of the supply voltage in the pixel circuit 110.

The OLED 130 is an element in which a white organic EL layer is sandwiched between the anode and the cathode having a light transmittance in the above-mentioned silicon substrate. In addition, a color filter corresponding to any of red (R), green (G), and blue (B) is overlaid on an emission side (the cathode side) of the OLED 130.

In the OLED 130 formed in such a manner, when a current flows from the anode to the cathode, holes injected from the anode and electrons injected from the cathode recombine together in the organic EL layer, thereby creating excitons, so that white light is emitted. With this configuration, white light emitted at this point is transmitted through the cathode on a side remote from the silicon substrate (anode), and is colored by the color filter. Thus, the white light is visually recognized by an observer.

Also in this embodiment, a shield pattern 117 that is connected to the supply line 16 and that is a wiring line (shield wiring line) for the purpose of inhibiting the influence of the field intensity on a gate wiring line of the transistor 121 extends to a position where the shield pattern 117 crosses the data line 14. At this intersection, a parallel-plate capacitor 134 is formed. The parallel-plate capacitor 134 causes the field intensity from the data line 14 to the gate wiring line of the transistor 121 to become weaker, thereby significantly reducing a parasitic capacitance 133. Details of this will be described below.

Operations of Electro-Optical Device

Figure 4:
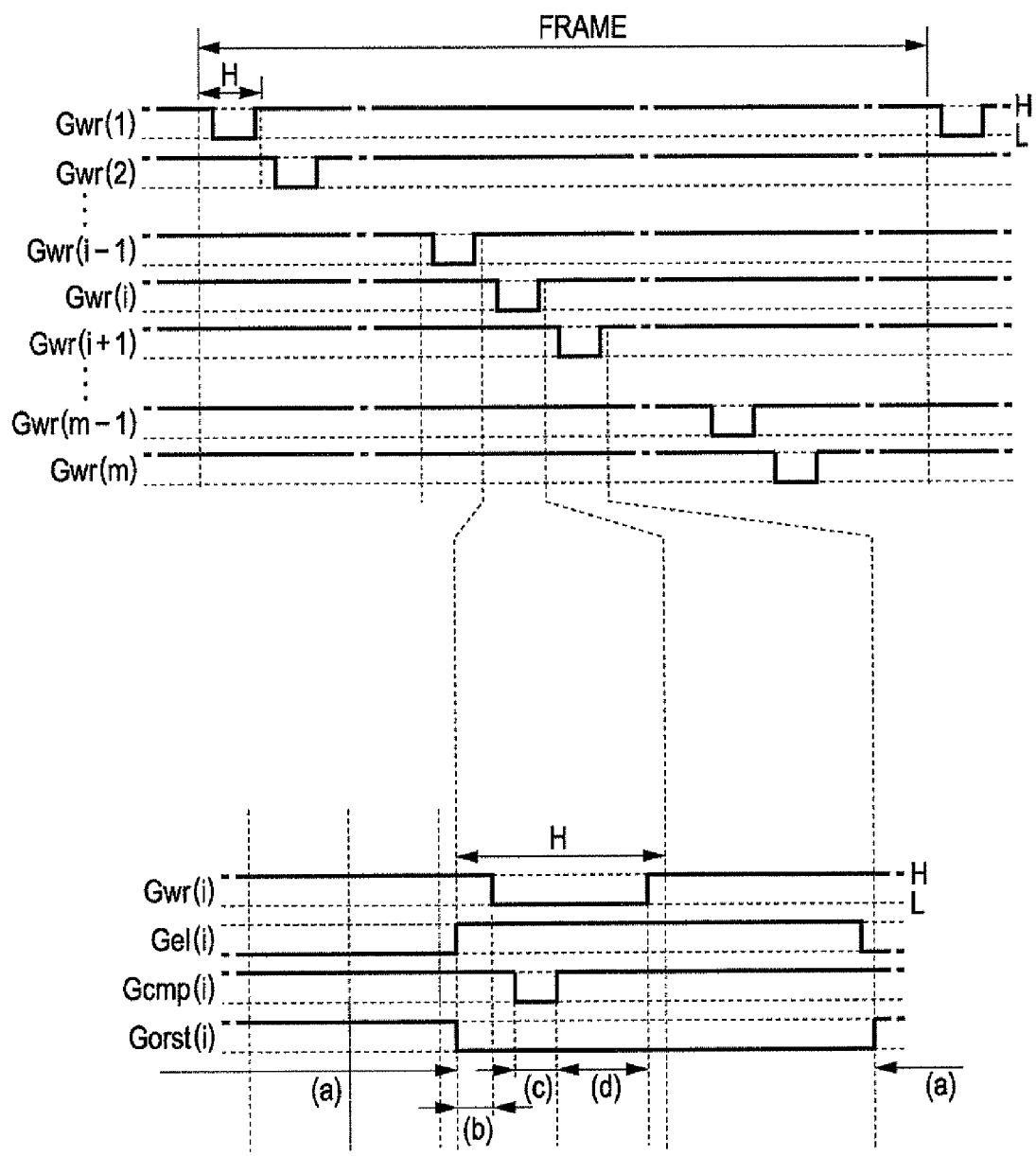
FIG. 4 is a timing chart for explaining operations of components in the electro-optical device.

With reference to FIG. 4, operations of the electro-optical device 10 will be described next. FIG. 4 is a timing chart for explaining operations of components in the electro-optical device 10.

As illustrated in the drawing, the scanning signals Gwr(1) to Gwr(m) are sequentially switched to level L, and 1-st to m-th scanning lines 12 are scanned in turn during the period of one frame in such a manner that one scanning line is scanned for each horizontal scanning period (H).

Operations during one horizontal scanning period (H) are common to the pixel circuits 110 of each row. In view of this, focusing attention on the i-th row and j-th column pixel circuit 110, the operations during the scanning period when the i-th scanning line is horizontally scanned (hereinafter referred to as an "i-th row scanning period") will be described below.

In this embodiment, the i-th row scanning period is roughly divided into an initialization period denoted by (b), a compensation period denoted by (c), and a writing period denoted by (d), in FIG. 4. Then, after an interval subsequent to the writing period of (d), there exists a light emitting period denoted by (a). After a lapse of the period of one frame, the i-th row scanning period starts again. Accordingly, in terms of temporal order, a cycle of (light emitting period)→initialization period→compensation period→writing period→(light emitting period) is repeated.

Light-Emitting Period

For the sake of explanatory convenience, the light emitting period, which is a precondition of the initialization period, will be described at the beginning. As illustrated in FIG. 4, in the i-th row light emitting period, the scanning signal Gwr(i) is at level H and the control signal Gel(i) is at level L. Among the control signals Gel(i), Gcmp(i), and Gorst(i), which are logic signals, the control signal Gel(i) is at level L and the control signals Gcmp(i) and Gorst(i) are at level H.

Therefore, in the i-th row and j-th pixel circuit 110 illustrated in FIG. 3, the transistor 124 is on whereas the transistors 122, 123, and 125 are off. Accordingly, the transistor 121 supplies a current Ids in accordance with a voltage Vgs between its gate and source to the OLED 130. As described below, in this embodiment, the voltage Vgs during the light emitting period has a value that varies from a threshold voltage of the transistor 121 in accordance with the potential of a data signal. The current in accordance with a gray scale level is therefore supplied to the OLED 130 in such a manner as to compensate for the threshold voltage of the transistor 121.

Note that since the i-th row light emitting period is a period during which scanning lines of rows other than the i-th row are horizontally scanned, the potential of the data line 14 suitably varies. However, in the i-th row pixel circuit 110, since the transistor 122 is off, the potential variation of the data line 14 is not taken into consideration here.

Initialization Period

Then, when the i-th row scanning period commences, the initialization period of (b) starts at the beginning as a first period. During the initialization period, the level of the control signal Gel(i) and the level of the control signal Gorst(i) change to level H and level L, respectively, from those in the light emitting period.

Therefore, in the i-th row and j-th pixel circuit 110 illustrated in FIG. 3, the transistor 124 is turned off, whereas the transistor 125 is turned on. This blocks a path through which a current is supplied to the OLED 130, and resets the anode of the OLED 130 to the potential Vorst.

Since the OLED 130 has a structure in which the anode and the cathode sandwich an organic light emitting layer as described above, there exists a parasitic, parallel capacitance between the anode and the cathode. When a current is flowing through the OLED 130 during the light emitting period, an anode-to-cathode voltage across the OLED 130 is held by this capacitance. The voltage that has been held, however, is reset by the transistor 125 turning on. For this reason, in this embodiment, when a current flows again to the OLED 130 in the next light emitting period, the current flow is less likely to be affected by the voltage held by that capacitance.

In particular, when the display state changes from a high-luminance state to a low-luminance state, for example, a high voltage in the high-luminance state (in which a large amount of current flows) is held if a pixel circuit has a configuration that does not allow for resetting. Even if an attempt is made to allow a small amount of current to flow subsequently, an excessive current flows in reality, making it impossible to achieve a low-luminance state. In contrast, the potential of the anode of the OLED 130 is reset by the transistor 125 turning on in this embodiment. This results in enhanced reproducibility of the low-luminance state.

Note that, in this embodiment, the potential Vorst is set such that the difference between that potential Vorst and the potential Vct of the common electrode 118 is less than a light emitting threshold voltage of the OLED 130. For this reason, in the initialization period (and the compensation period as well as the writing period, which will be described below), the OLED 130 is off (non-light emitting).

Compensation Period

The compensation period of (c) next commences as a second period in the i-th row scanning period. During the compensation period, compared to the initialization period, the scanning signal Gwr(i) and the control signal Gcmp(i) are set at level L. During the compensation period, on the other hand, a control signal /Gini is at level H under the condition that the control signal Gref remains at level H.

During the compensation period, the transistor 123 is on, and therefore the transistor 121 becomes diode-connected. For this reason, a drain current flows through the transistor 121 to charge the gate node g and the data line 14. In particular, a current flows through a path of the supply line 116→the transistor 121→the transistor 123→the transistor 122→the j-th data line 14. Accordingly, the transistor 121 turning on causes rises in the potentials of the data line 14 and the gate node g that are in a state of being mutually connected.

However, assuming that the threshold voltage of the transistor 121 is |Vth|, the closer the gate node g approaches a potential (Vel−|Vth|), the less a current is likely to flow through the above path, and therefore the data line 14 and the gate node g are saturated at a potential (Vel−|Vth|) by the time the compensation period is completed. Accordingly, the storage capacitor 132 holds the threshold voltage |Vth| of the transistor 121 by the time the compensation period is completed.

Writing Period

Subsequent to the compensation period, the writing period of (d) appears as a third period. During the writing period, the control signal Gcmp(i) is set at level H, the diode connection of the transistor 121 is canceled. The potential in the path from the j-th data line 14 to the gate node g in the i-th row and j-th column pixel circuit 110 is maintained at (Vel−|Vth|) owing to the storage capacitor 132.

Light Emitting Period

After completion of the writing period for the i-th row, the light emitting period appears. In the light emitting period, since the control signal Gel(i) is set at level L as mentioned above, the transistor 124 is turned on in the i-th row and j-th column pixel circuit 110. The current in accordance with a gray scale level, in such a state as to compensate for the threshold voltage of the transistor 121, is supplied to the OLED 130.

The aforementioned operations are also performed in other pixel circuits 110 other than the j-th pixel circuit 110 in parallel in time, during the i-th row scanning period. Moreover, the operations in such a manner during the i-th row scanning period are, in reality, performed in order of the 1-st, 2-nd, 3-rd, . . . , (m−1)-th, and m-th row during the period of one frame, and are repeated frame by frame.

As indicated by a dashed line in FIG. 3, the parasitic capacitance 133 is, in reality, generated between the data line 14 and the gate node g in the pixel circuit 110. Accordingly, if the width of variation in potential of the data line 14 is large, the variation spreads through the parasitic capacitance 133 to the gate node g, thereby generating what is called a cross talk, unevenness, or the like. This results in a reduction in display quality. The effect of the parasitic capacitor 133 is outstandingly exerted when the pixel circuit 110 is miniaturized.

In this embodiment, however, as illustrated in FIG. 3, the shield pattern 117 connected to the supply line 16 extends to a position where the shield pattern 117 crosses the data line 14. At this intersection, a parallel-plate capacitor 134 is formed. The parallel-plate capacitor 134 causes the field intensity from the data line 14 to the gate wiring line of the transistor 121 to become weaker, thereby significantly reducing the parasitic capacitance 133.

As a more desirable configuration according to an aspect of the invention, it is preferable that the shield pattern 117 extending from the supply line 16 cross the data line 14 in the immediate vicinity of a wiring line in which noise is generated and a node that is affected by the noise. This significantly reduces the influence of electric fields.

Moreover, with this configuration, noise is applied to the shield pattern 117 itself; however, the noise application has no effect on display quality of the pixel in question because the shield pattern 117 extends from the adjacent pixel in which a picture signal will be written next time. Even if variations due to noise occur in the adjacent pixel, a normal picture signal is written at the next timing, and therefore display quality is not affected.

According to this embodiment, a period longer than a scanning period, for example, two horizontal scanning periods can be allocated as a period during which the transistor 125 is on, that is, a reset period of the OLED 130. The voltage held by the parasitic capacitance of the OLED 130 during a light emitting period can therefore be sufficiently initialized.

According to this embodiment, the influence of the threshold voltage on the current Ids, which is supplied to the OLED 130 by the transistor 121, is offset. Therefore, according to this embodiment, if the threshold voltage of the transistor 121 varies for every pixel circuit 110, the variation is compensated for and a current in accordance with a gray scale level is supplied to the OLED 130. Display unevenness in such a manner as to impair the equality of a display screen can therefore be inhibited. As a result, display in high quality is enabled.

Moreover, according to this embodiment, since the shield pattern 117 connected to the supply line 16 extends to a position where the shield pattern 117 crosses the data line 14, and the parallel-plate capacitor 134 is formed at this intersection, the field intensity from the data line 14 to the gate wiring line of the transistor 121 becomes weaker. This can significantly reduce the parasitic capacitance 133. As a result, what is called a cross talk, unevenness, or the like that would spread through the parasitic capacitance 133 to the gate node g can be reliably inhibited. Thus, display in high quality is enabled.

Structure of Pixel Circuit

Figure 5:
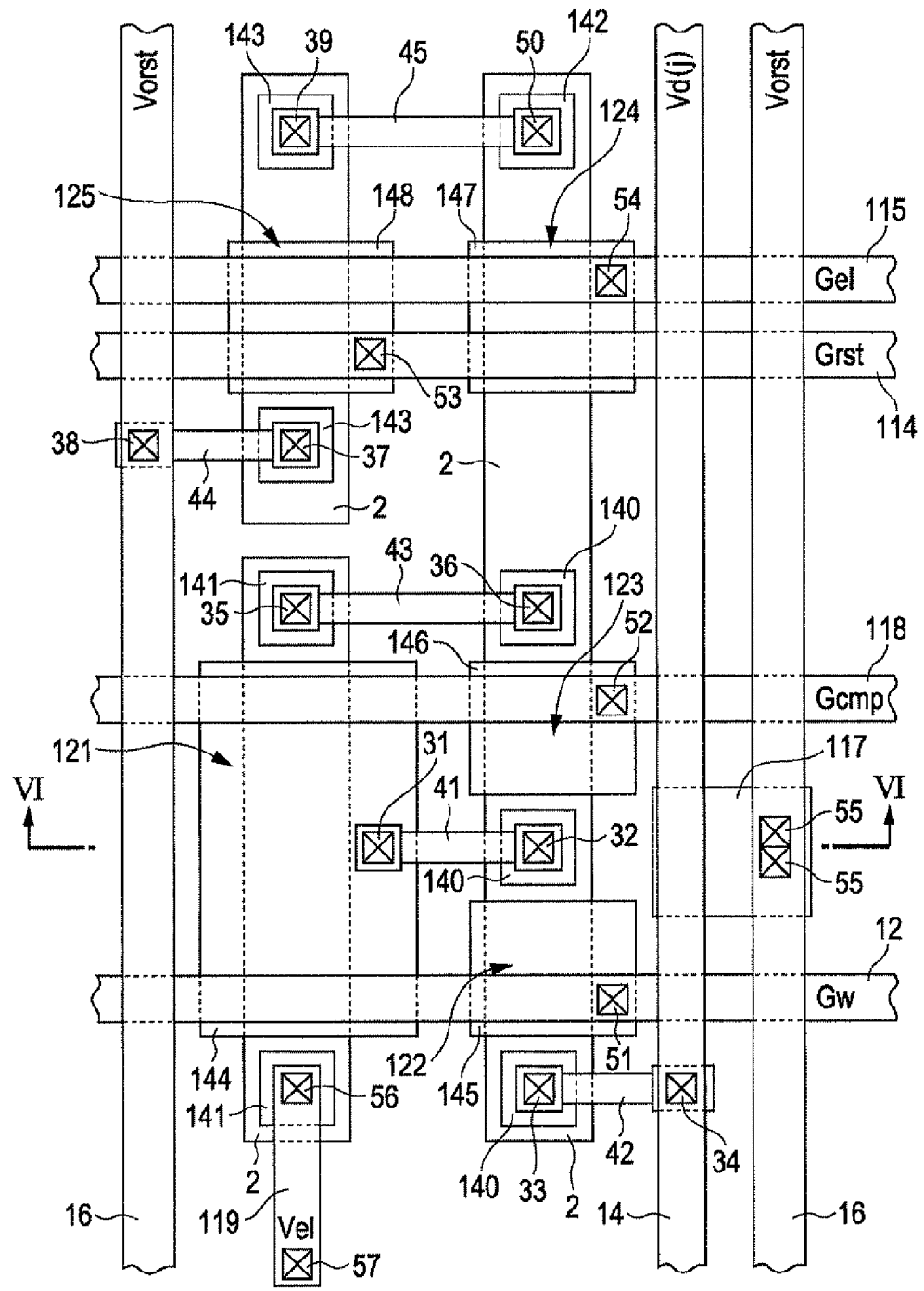
FIG. 5 is a plan view illustrating a configuration of a pixel circuit in the electro-optical device.

The structure of the pixel circuit 110 will be described next with reference to FIG. 5 and FIG. 6. FIG. 5 is a plan view illustrating a configuration of one pixel circuit 110, and FIG. 6 is a partial sectional view taken along the line VI-VI of FIG. 5.

Note that FIG. 5, which illustrates a wiring structure of the top-emission pixel circuit 110 in plan view from the observation side, omits a structure formed after the pixel electrode (anode) of the OLED 130 for the sake of simplicity. In the drawings referred to herein, the scales of layers, members, and regions are changed so that each of the layers, members, and regions can be recognized.

Figure 6:
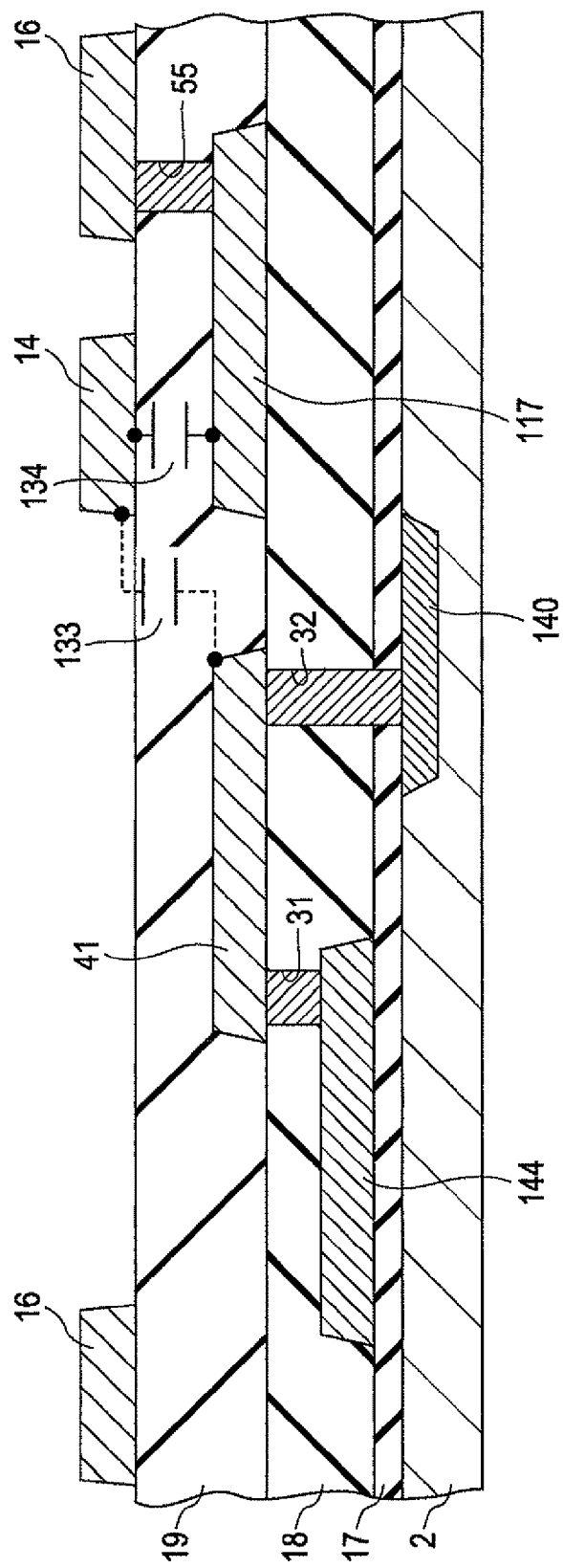
FIG. 6 is a partial sectional view taken along the line VI-VI of FIG. 5.

As illustrated in FIG. 6, a substrate 2 used as the foundation is provided. The substrate 2, which is provided as a flat plate in reality, is represented in islands in FIG. 5 so that the position of each transistor can be readily understood.

As illustrated in FIG. 6, an active region 140 for formation of the transistor 122 and the transistor 123 is formed in the substrate 2. The active region as used here is a region in which a MOS transistor is formed. Like the active region 140, as illustrated in FIG. 5, active regions 141, 142, and 143 are provided in the substrate 2. The active region 141 constitutes the transistor 121, the active region 142 constitutes the transistor 124, and the active region 143 constitutes the transistor 125.

As illustrated in FIG. 6, a gate insulating film 17 is provided in such a manner as to cover almost the whole surface of the active regions 140 to 143. A gate wiring layer of aluminum, polysilicon, or the like is provided on the surface of the gate insulating film 17, and a gate electrode 144 is provided by patterning the gate wiring layer. The gate electrode 144 is the gate electrode of the transistor 121. As illustrated in FIG. 5, a gate electrode 145 of the transistor 122, a gate electrode 146 of the transistor 123, a gate electrode 147 of the transistor 124, and a gate electrode 148 of the transistor 125 are provided at the same level as the gate electrode 144.

In FIG. 6, a first interlayer insulating film 18 is formed in such a manner as to cover the gate electrode 144 or the gate insulating film 17. A conductive wiring layer is formed on the surface of first interlayer insulating film 18, and a relay electrode 41 is formed by patterning the wiring layer. As illustrated in FIG. 5, relay electrodes 42, 43, 44, and 45 are formed at the same level as the relay electrode 41.

Among these relay electrodes, the relay electrode 41 is connected to the gate electrode 144 of the transistor 121 via a contact hole 31 formed in the first interlayer insulating film 18. The relay electrode 41 is connected to the active region 140 for the transistor 122 and the transistor 123 via a contact hole 32 formed in the first interlayer insulating film 18 as well as in the gate insulating film 17.

Note that, in FIG. 5, portions denoted by "x" on top of square marks in areas where different types of wiring layers overlap are contact holes.

In FIG. 5, one end of the relay electrode 42 is connected to the active region 140 of the transistor 122 via a contact hole 33 formed in the first interlayer insulating film 18 as well as in the gate insulating film 17, whereas the other end of the relay electrode 42 is connected to the data line 14 described below via a contact hole 34 formed in a second interlayer insulating film 19 described below.

One end of the relay electrode 43 is connected to the active region 141 of the transistor 121 via a contact hole 35 formed in the first interlayer insulating film 18 as well as in the gate insulating film 17, whereas the other end of the relay electrode 43 is connected to the active region 140 of the transistor 123 via a contact hole 36 formed in the first interlayer insulating film 18 as well as in the gate insulating film 17.

One end of the relay electrode 44 is connected to the active region 143 of the transistor 125 via a contact hole 37 formed in the first interlayer insulating film 18 as well as in the gate insulating film 17, whereas the other end of the relay electrode 44 is connected to the supply line 16 described below via a contact hole 38 formed in the second interlayer insulating film 19 described below.

One end of the relay electrode 45 is connected to the active region 143 of the transistor 125 via a contact hole 39 formed in the first interlayer insulating film 18 as well as in the gate insulating film 17, whereas the other end of the relay electrode 45 is connected to the active region 142 of the transistor 124 via a contact hole 50 formed in the first interlayer insulating film 18 as well as in the gate insulating film 17.

The scanning line 12 and the control lines 118, 114, and 115 are formed at the same level as the aforementioned relay electrodes 41, 42, 43, 44, and 45. The scanning line 12 is connected to the gate electrode 145 of the transistor 122 via a contact hole 51 formed in the first interlayer insulation film 18. The control line 118 is connected to the gate electrode 146 of the transistor 123 via a contact hole 52 formed in the first interlayer insulation film 18. The control line 114 is connected to the gate electrode 148 of the transistor 125 via a contact hole 53 formed in the first interlayer insulation film 18. The control line 115 is connected to the gate electrode 147 of the transistor 124 via a contact hole 54 formed in the first interlayer insulation film 18.

Moreover, as illustrated in FIG. 6, the shield pattern 117 is formed at the same level as the aforementioned relay electrodes 41, 42, 43, 44, and 45. The shield pattern 117 extends from below the supply line (constant potential wiring line) 16 to below the data line 14 when seen in plan view, and is formed so as to have a large width in the longitudinal direction of the data line 14 as illustrated in FIG. 5. Here, "when seen in plan view" corresponds to "when seen from a third direction" according to an aspect of the invention. Also, "below" of the "below the supply line (constant potential wiring line) 16" and the "below the data line 14" means the side of the substrate 2 of the supply line (constant potential wiring line) 16 and of the data line 14, respectively, and "the longitudinal direction of the data line 14" corresponds to a "second direction" according to an aspect of the invention.

By forming the shield pattern 117 in such a manner as to cross the data line 14 as described above, the parallel-plate capacitor 134 is formed. As a result, the field intensity from the data line 14 to the relay electrode 41 and to the gate electrode 144 of the transistor 121, which is electrically connected to the relay electrode 41, becomes weaker. This can significantly reduce the effect of the parasitic capacitor 133 formed between the relay electrode 41 and the data line 14.

As a more desirable configuration according to an aspect of the invention, it is preferable that the shield pattern 117, which extends from the supply line (constant potential wiring line) 16, and the data line 14 cross in the immediate vicinity of a wiring line in which noise is generated and a node that is affected by the noise. More specifically, assuming that an area where the shield pattern 117 and the data line 14 cross is a crossing area, it is preferable that the relay electrode 41 be provided within a width in the longitudinal direction of the data line in the crossing area. In this case, since the parallel-plate capacitor 134 is formed in the crossing area and the relay electrode 41 is provided within the width in the longitudinal direction of the data line 14 of the crossing area. The field intensity from the data line 14 to the relay electrode 41 electrically connected to the gate of transistor 121 to be protected, which is located in the vicinity of the parallel-plate capacitor 134, becomes weaker. This can significantly reduce a parasitic capacitance formed from the data line 14 to the relay electrode 41 and to the gate of the transistor 121. As a result, noise application to the gate of the transistor 121 can be reduced.

Moreover, this configuration allows the shield pattern 117 to be formed without addition of a new manufacturing process. An increase in cost can therefore be inhibited.

With this configuration, noise is applied to the shield pattern 117 itself. In the case where point-sequential operations are employed, however, the noise application has no effect on display quality of the pixel in question because the shield pattern 117 extends from the adjacent pixel in which a picture signal will be written next time. Even if variations due to noise occur in the adjacent pixel, a normal picture signal is written at the next timing, and therefore display quality is not affected.

The second interlayer insulating film 19 is formed so as to cover the relay electrodes 41, 42, 43, 44, and 45, the scanning line 12, and the control lines 118, 114, and 115 as well as the shield pattern 117, or the first interlayer insulating film 18. A conductive wiring layer is formed on the surface of the second interlayer insulating film 19, and the data line 14 and the supply line 16 as well as a connection portion 119 to a power supply line (not illustrated) are formed by patterning the wiring layer.

Among the formed components, the supply line 16 is connected to the shield pattern 117 via contact holes 55 formed in the second interlayer insulating film 19. The supply line 16 is also connected to the relay electrode 44 via the contact hole 38 formed in the second interlayer insulating film 19, as described above. Moreover, the data line 14 is connected to the relay electrode 42 via the contact hole 34 formed in the second interlayer insulating film 19. Moreover, the connection portion 119 to the power supply line is connected to the active region 141 of the transistor 121 via a contact hole 56 formed in the second interlayer insulating film 19, the first interlayer insulating film 18, and the gate insulating film 17. The connection portion 119 to the power supply line is also connected via a contact hole 57 to the power supply line in a layer higher than the layer illustrated in FIG. 5.

Note that the capacitor 132 illustrated in FIG. 3 is formed in a layer higher than the supply line 16 and higher than the data line 14 mentioned above, which is not illustrated.

The structure downstream of the aforementioned structure of the electro-optical device 10 is not illustrated. In this structure, a light emitting layer made of an organic EL material is stacked for every pixel circuit 110 over the anode, and a transparent electrode common to all the pixel circuits 110 is provided as the common electrode 118, which serves also as the cathode. Thus, a light emitting element 150 is an OLED in which the anode and the cathode opposite to each other sandwich the light emitting layer, and emits light with a luminance in accordance with a current flowing from the anode to the cathode. The emitted light is observed such that it travels toward the opposite to the substrate 2 (top emission structure). In addition, sealing glass for blocking the light emitting layer from the atmosphere, and the like are provided, the description of which is omitted. In FIG. 5, a pixel electrode, which is the anode of the OLED 130, is not illustrated.

Applications and Modifications

The invention is not limited to the foregoing embodiment, applications, and the like. Various modifications as described below, for example, can be made. Among examples of modifications described below, one or a plurality of examples arbitrarily selected can be appropriately combined.

Control Circuit

In the embodiment, the control circuit 5 that supplies data signals is formed separately from the electro-optical device 10. However, the control circuit 5, together with the scanning line driving circuit 20, the demultiplexer 30, and a level shift circuit 40, may be integrated in a silicon substrate.

Substrate

In the configuration of the embodiment, the electro-optical device 10 is integrated in a silicon substrate. Another configuration in which this device is integrated in another semiconductor substrate may be used. In addition, this device may be formed in a glass substrate or the like by application of a polysilicon process. Any of these ways is effective for a configuration in which the pixel circuit 110 becomes miniaturized such that, in the transistor 121, variations in drain current are exponentially large relative to variations in the gate voltage Vgs.

Control Signal Gcmp(i)

In the embodiment and the like, regarding the i-th row, the control signal Gcmp(i) is set at level H during the writing period; however, it may be set at level L. That is, there may be used a configuration in which compensation for the threshold caused by the transistor 123 turning on is performed in parallel with writing in the node gate g.

Channel Types of Transistors

In the foregoing embodiment, the transistors 121 to 125 in the pixel circuit 110 are all of the same p-channel type. However, they may be all of the same n-channel type. The p-channel transistors and the n-channel transistors may also be combined appropriately.

Shield Pattern

In the foregoing embodiment, an example in which the shield pattern 117 is formed in the same layer as that of the gate wiring line of a transistor to be protected. However, the invention is not limited to such a configuration, and the shield pattern 117 may be formed in a wiring layer higher than the gate wiring line. The parasitic capacitance 133 is preferentially formed between a wiring line in which noise is generated, and the gate wiring line of a transistor to be protected that is located in the vicinity of the wiring line. Accordingly, when the shield pattern 117 is formed of a wiring line in the same layer as or a higher layer than the gate wiring line of the transistor to be protected, the parallel-plate capacitor 134 is formed between the wiring line in which noise is generated and the shield pattern 117, so that a higher noise reduction effect can be obtained.

Others

In the embodiment and the like, an OLED, which is a light emitting element, is exemplified as an electro-optical element. There may be used any other element that emits light with a luminance in accordance with a current, such as an inorganic light emitting diode or a light emitting diode (LED).

Electronic Apparatus

An electronic apparatus to which the electro-optical device 10 according to the embodiment, or the like, or an application example is applied will be described next. The electro-optical device 10 is suitable for the use of high definition display for which a pixel is small in size. Therefore, a head-mounted display will be described by way of example as an electronic apparatus.

Figure 7:
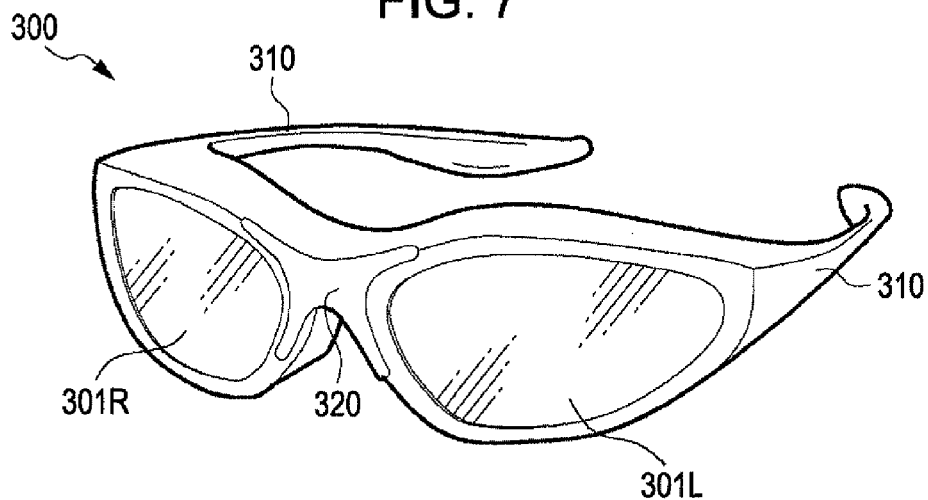
FIG. 7 is a perspective view illustrating an HMD using the electro-optical device according to the embodiment.
Figure 8:
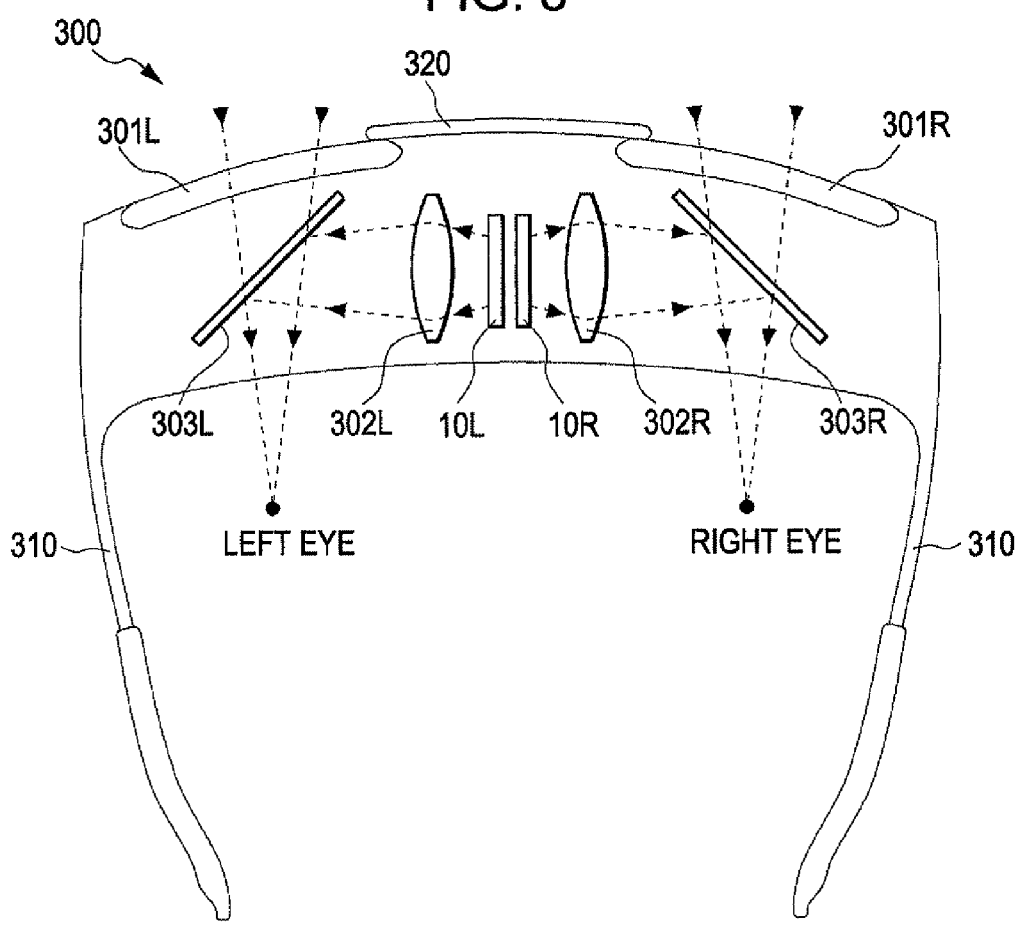
FIG. 8 illustrates an optical configuration of the HMD.

FIG. 7 illustrates the appearance of a head-mounted display, and FIG. 8 illustrates an optical configuration thereof.

As illustrated in FIG. 7, a head-mounted display 300 has temples 310, a bridge 320, and lenses 301L and 301R outwardly in the same manner as typical glasses. As illustrated in FIG. 8, the head-mounted display 300 is provided with an electro-optical device 10L for a left eye and an electro-optical device 10R for a right eye near the bridge 320 and on a back side (on a lower side in the drawing) of the lenses 301L and 301R, respectively.

The image display surface of the electro-optical device 10L is disposed to the left of FIG. 8. This causes a display image created by the electro-optical device 10L to be emitted in the direction of 9:00 in the drawing through an optical lens 302L. A half mirror 303L reflects the display image from the electro-optical device 10L in the direction of 6:00, and allows light that has entered from the direction of 12:00 to pass therethrough. The image display surface of the electro-optical device 10R is disposed to the right of FIG. 8, which is the opposite to that of the electro-optical device 10L. This causes a display image created by the electro-optical device 10R to be emitted in the direction of 3:00 in the drawing through an optical lens 302R. A half mirror 303R reflects the display image from the electro-optical device 10R in the direction of 6:00, and allows light that has entered from the direction of 12:00 to pass therethrough.

In this configuration, a person wearing the head-mounted display 300 can observe display images created by the electro-optical devices 10L and 10R in a see-through state in which the display images are superimposed over the outside scene. When, in the head-mounted display 300, one of both eyes' images with a parallax, that is, an image for a left eye is displayed on the electro-optical device 10L and the other, that is, an image for a right eye is displayed on the electro-optical device 10R, a person wearing the head-mounted display 300 can perceive a displayed image as having depth and a cubic effect (three dimensional (3D) display).

Note that the electro-optical device 10 is applicable to an electronic view finder in a video camera, an interchangeable lens digital camera, and the like, in addition to the head-mounted display 300.

The entire disclosure of Japanese Patent Application No. 2011-265503, filed Dec. 5, 2011 is expressly incorporated by reference herein.

What is claimed is:

1. An electro-optical device, the electro-optical device including:
   a first pixel circuit having a first light emitting element and a first driving transistor configured to control a current flowing through the first light emitting element;
   a second pixel circuit having a second light emitting element and a second driving transistor configured to control a current flowing through the second light emitting element, the second pixel circuit being arranged adjacent to the first light emitting element along a first direction;
   a power supply line connected to the first driving transistor and the second driving transistor;
   a first constant potential wiring line arranged along a second direction crossing the first direction, the first constant potential wiring line being electrically connected to the first pixel circuit;
   a first data line arranged along the second direction, the first data line being electrically connected to the first pixel circuit;
   a second constant potential wiring line arranged along the second direction, the second constant potential wiring line being electrically connected to the second pixel circuit;
   a second data line arranged along the second direction, the second data line being electrically connected to the second pixel circuit; and
   a wiring line connected to the second constant potential wiring line,
   wherein the first data line and the wiring line overlap when seen from a third direction perpendicular to the first direction and to the second direction.

2. The electro-optical device according to claim 1, wherein the first light emitting element includes a first pixel electrode, a counter electrode disposed so as to be opposite to the first pixel electrode, and an organic light emitting layer disposed between the first pixel electrode and the counter electrode,
   wherein the first pixel circuit includes
      a switching transistor disposed between a gate electrode of the driving transistor and the first data line, and
      a relay electrode connecting the gate electrode of the driving transistor and the switching transistor, and
   wherein the relay electrode is provided within a width of the wiring line when seen from the first direction.

3. The electro-optical device according to claim 2, wherein the relay electrode is provided in a layer between the first data line and the gate electrode of the driving transistor.

4. The electro-optical device according to claim 2, wherein the relay electrode is provided in the same layer as the gate electrode of the driving transistor.

5. The electro-optical device according to claim 1, wherein the first light emitting element and the second light emitting element emit light of different wavelengths.

6. The electro-optical device according to claim 1, wherein the wiring line is provided in a layer between the first data line and a gate electrode of the driving transistor.

7. The electro-optical device according to claim 6, wherein the wiring line is provided in the same layer as the gate electrode of the driving transistor.

8. The electro-optical device according to claim 1, wherein a gate electrode of the driving transistor is provided in area where the first data line is not provided.

9. An electro-optical device comprising:
   a power supply line;
   a plurality of scanning lines and a plurality of data lines crossing each other;
   a constant potential wiring line configured to supply a predetermined potential;
   a shield wiring line electrically connected to the constant potential line; and
   a plurality of pixel circuits provided corresponding to intersections of the plurality of scanning lines and the plurality of data lines,
   wherein each of the plurality of pixel circuits includes:
      a light emitting element;
      a driving transistor configured to control a current flowing through the light emitting element, the driving transistor being connected to the power supply line; and
      a switching transistor connected between a gate of the driving transistor and a data line among the plurality of data lines, the switching transistor controlling a conductive state according to a scanning signal supplied to one scanning line among the plurality of scanning lines, and
   wherein the shield wiring line is formed so as to extend from the constant potential wiring line for one pixel circuit to a lower portion of one data line for another pixel circuit adjacent to the one pixel circuit in such a manner that at least part of the shield wiring line crosses the one data line.

10. The electro-optical device according to claim 9, wherein, assuming that an area where the shield wiring line and the one data line cross is a crossing area, the gate of the driving transistor is disposed within a width in a longitudinal direction of the one data line in the crossing area.

11. The electro-optical device according to claim 9, wherein the shield wiring line is formed in a wiring layer lower than the one data line, the wiring layer being the same layer as or a higher layer than the gate of the driving transistor.

12. An electronic apparatus comprising the electro-optical device according to claim 1.

13. An electronic apparatus comprising the electro-optical device according to claim 2.

14. An electronic apparatus comprising the electro-optical device according to claim 3.

15. An electronic apparatus comprising the electro-optical device according to claim 4.

16. An electronic apparatus comprising the electro-optical device according to claim 5.

17. An electronic apparatus comprising the electro-optical device according to claim 6.

18. An electronic apparatus comprising the electro-optical device according to claim 7.

19. An electronic apparatus comprising the electro-optical device according to claim 8.

20. An electronic apparatus comprising the electro-optical device according to claim 9.

* * * * *